(12) United States Patent
Zhang et al.

(10) Patent No.: US 10,027,330 B1
(45) Date of Patent: Jul. 17, 2018

(54) ARBITRATING CIRCUIT

(71) Applicant: FARADAY TECHNOLOGY CORPORATION, Hsinchu (TW)

(72) Inventors: Zhao-Yong Zhang, Hsinchu (TW); Shih-Chin Lin, Hsinchu (TW); Wei-Chang Wang, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 15/889,740

(22) Filed: Feb. 6, 2018

(30) Foreign Application Priority Data

Sep. 22, 2017 (CN) .......................... 2017 1 0866229

(51) Int. Cl.
*H03K 19/20* (2006.01)
*G06F 17/50* (2006.01)
(52) U.S. Cl.
CPC ........... *H03K 19/20* (2013.01); *G06F 17/505* (2013.01)
(58) Field of Classification Search
CPC ............................... H03K 19/20; G06F 17/505
USPC ........................................................ 326/104
See application file for complete search history.

(56) References Cited

U.S. PATENT DOCUMENTS

| 4,757,217 | A | * | 7/1988 | Sawada | ................. | G11C 11/406 327/142 |
| 4,841,178 | A | * | 6/1989 | Bisson | ................. | G06F 13/364 327/19 |
| 4,864,243 | A | * | 9/1989 | Reese | ................. | G06F 13/1605 326/94 |
| 4,962,379 | A | * | 10/1990 | Yasuda | ................. | G06F 13/364 370/462 |
| 6,498,513 | B1 | | 12/2002 | Reynolds | | |
| 6,617,900 | B1 | * | 9/2003 | Blair | .................... | H03K 3/0375 327/19 |
| 7,064,583 | B1 | * | 6/2006 | Ebergen | ................. | G06F 13/14 326/104 |
| 7,398,442 | B2 | * | 7/2008 | Peeters | ............ | G01R 31/31701 714/731 |
| 7,650,454 | B2 | * | 1/2010 | Shukla | .................... | G06F 13/14 326/94 |
| 2002/0166003 | A1 | * | 11/2002 | Nystrom | ................. | G06F 13/14 710/18 |

OTHER PUBLICATIONS

Jan M. Rabaey, et. al, "Digital Integrated Circuits a Design Perspective (Second Edition)", Ch. 10, p. 538-539. Pearson Education, 2003.

* cited by examiner

*Primary Examiner* — Don Le
(74) *Attorney, Agent, or Firm* — Winston Hsu

(57) ABSTRACT

An arbitrating circuit includes a first NOR gate, a second NOR gate, four resistors and a pull-up circuit. The first transistor is connected with the first node and the second node, and generates a first acknowledging signal. The second transistor is connected with a supply voltage, the second node and the first transistor. The third transistor is connected with the first node and second node, and generates a second acknowledging signal. The fourth transistor is connected with the supply voltage, the first node and the third transistor. The pull-up circuit is connected with the first node, the second node, the first NOR gate and the second NOR gate. If both of the first request signal and the second request signal have a low logic level, a voltage at the second node is pulled up to a high logic level by the pull-up circuit.

10 Claims, 4 Drawing Sheets

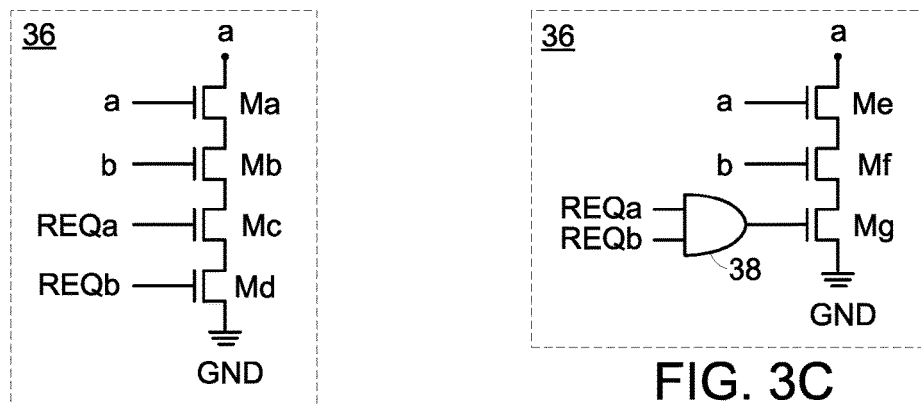
FIG. 3B
FIG. 3C
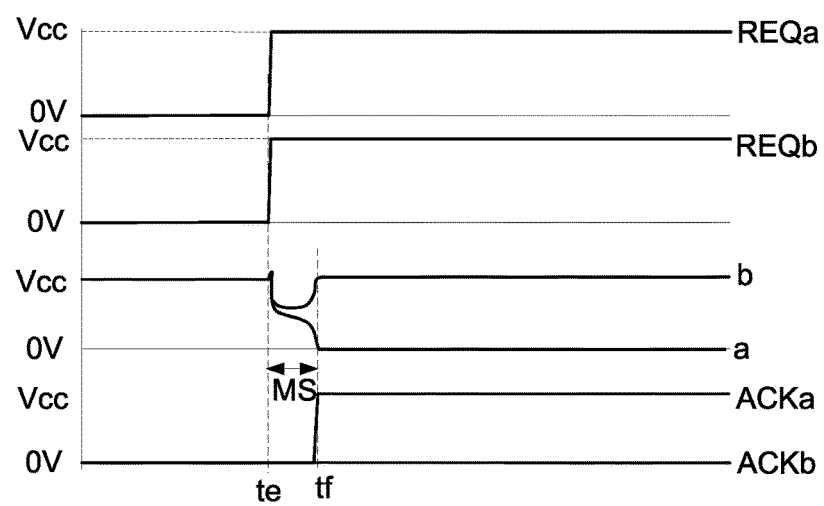
FIG. 3D

US 10,027,330 B1

ARBITRATING CIRCUIT

This application claims the benefit of People's Republic of China Patent Application No. 201710866229.7, filed Sep. 22, 2017, the subject matter of which is incorporated herein by reference.

FIELD OF THE INVENTION

The present invention relates to an electronic circuit, and more particularly to an asynchronous arbitrating circuit.

BACKGROUND OF THE INVENTION

An arbitrating circuit is important for designing a logic circuit. The arbitrating circuit receives plural request signals and determines the priorities of the request signals according to the sequence of the request signals.

For example, in case that a circuit system comprises plural controllers to access the memory, the circuit system has to be equipped with an arbitrating circuit. When the plural controllers issue read commands, the arbitrating circuit determines which controller is acknowledged to have the priority to read the data from the memory according to the sequence of the read commands. In addition, the other controllers are not acknowledged to read the data from the memory.

SUMMARY OF THE INVENTION

An embodiment of the present invention provides an arbitrating circuit. The arbitrating circuit includes a first NOR gate, a second NOR gate, a first transistor, a second transistor, a third transistor, a fourth transistor and a pull-up circuit. A first input terminal of the first NOR gate receives a first request signal. A second input terminal of the first NOR gate is connected with a first node. An output terminal of the first NOR gate is connected with a second node. A first input terminal of the second NOR gate receives a second request signal. A second input terminal of the second NOR gate is connected with the second node. An output terminal of the second NOR gate is connected with the first node. A source terminal of the first transistor is connected with the first node. A gate terminal of the first transistor is connected with the second node. A drain terminal of the first transistor generates a first acknowledging signal. A source terminal of the second transistor is connected with a supply voltage. A gate terminal of the second transistor is connected with the second node. A drain terminal of the second transistor is connected with the drain terminal of the first transistor. A source terminal of the third transistor is connected with the second node. A gate terminal of the third transistor is connected with the first node. A drain terminal of the third transistor generates a second acknowledging signal. A source terminal of the fourth transistor is connected with the supply voltage. A gate terminal of the fourth transistor is connected with the first node. A drain terminal of the fourth transistor is connected with the drain terminal of the third transistor. The pull-up circuit is connected with the first node, the second node, the first input terminal of the first NOR gate and the first input terminal of the second NOR gate. If both of the first request signal and the second request signal have a low logic level, a voltage at the second node is pulled up to a high logic level by the pull-up circuit.

Another embodiment of the present invention provides an arbitrating circuit. The arbitrating circuit includes a first NAND gate, a second NAND gate, a first transistor, a second transistor, a third transistor, a fourth transistor and a pull-down circuit. A first input terminal of the first NAND gate receives a first request signal. A second input terminal of the first NAND gate is connected with a first node. An output terminal of the first NAND gate is connected with a second node. A first input terminal of the second NAND gate receives a second request signal. A second input terminal of the second NAND gate is connected with the second node. An output terminal of the second NAND gate is connected with the first node. A source terminal of the first transistor is connected with the first node. A gate terminal of the first transistor is connected with the second node. A drain terminal of the first transistor generates a first acknowledging signal. A source terminal of the second transistor is connected with a ground terminal. A gate terminal of the second transistor is connected with the second node. A drain terminal of the second transistor is connected with the drain terminal of the first transistor. A source terminal of the third transistor is connected with the second node. A gate terminal of the third transistor is connected with the first node. A drain terminal of the third transistor generates a second acknowledging signal. A source terminal of the fourth transistor is connected with the ground terminal. A gate terminal of the fourth transistor is connected with the first node. A drain terminal of the fourth transistor is connected with the drain terminal of the third transistor. A pull-down circuit is connected with the first node, the second node, the first input terminal of the first NAND gate and the first input terminal of the second NAND gate. If both of the first request signal and the second request signal have a high logic level, a voltage at the second node is pulled down to a low logic level by the pull-down circuit.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3B is a schematic circuit diagram illustrating an exemplary pull-down circuit used in the arbitrating circuit of FIG. 3A;

FIG. 3C is a schematic circuit diagram illustrating another exemplary pull-down circuit used in the arbitrating circuit of FIG. 3A; and FIG. 3D is a schematic timing waveform diagram illustrating associated signals of the arbitrating circuit of FIG. 3A.

DETAILED DESCRIPTION OF PREFERRED EMBODIMENTS

Figure 1A:
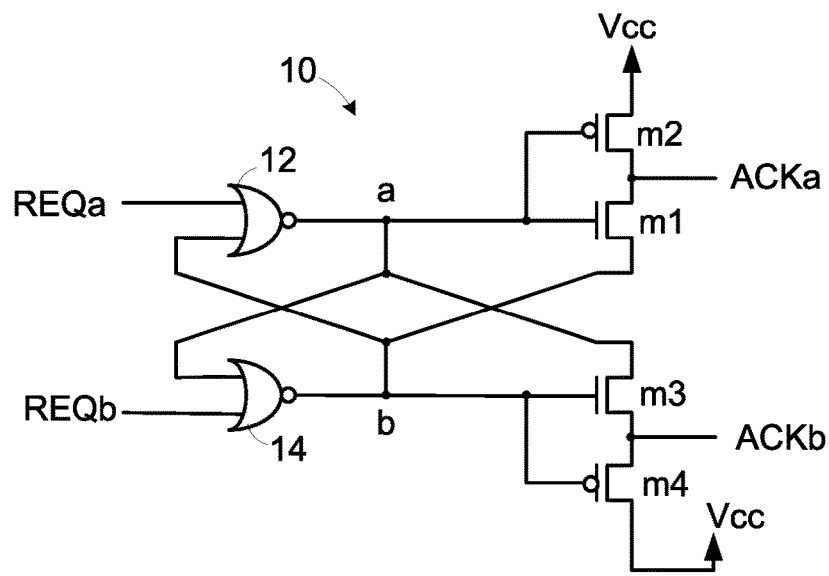
FIG. 1A is a schematic circuit diagram illustrating an arbitrating circuit according to a first embodiment of the present invention.
Figure 1B:
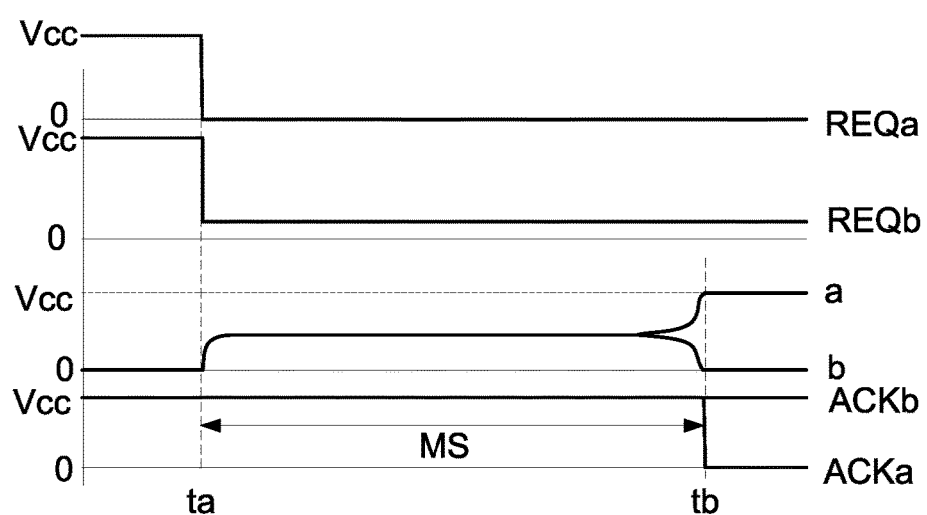
FIG. 1B is a schematic timing waveform diagram illustrating associated signals of the arbitrating circuit of FIG. 1A.

FIG. 1A is a schematic circuit diagram illustrating an arbitrating circuit according to a first embodiment of the present invention. FIG. 1B is a schematic timing waveform diagram illustrating associated signals of the arbitrating circuit of FIG. 1A. The arbitrating circuit 10 comprises a first NOR gate 12, a second NOR gate 14, and four transistors m1~m4. The transistors m1 and m3 are N-type transistors. The transistors m2 and m4 are P-type transistors.

A first input terminal of the first NOR gate 12 receives a request signal REQa. A second input terminal of the first NOR gate 12 is connected with a node "b". An output terminal of the first NOR gate 12 is connected with a node "a". A first input terminal of the second NOR gate 14 receives a request signal REQb. A second input terminal of the second NOR gate 14 is connected with the node "a". An output terminal of the second NOR gate 14 is connected with the node "b".

The source terminal of the transistor m1 is connected with the node "b". The gate terminal of the transistor m1 is connected with the node "a". The drain terminal of the transistor m1 generates an acknowledging signal ACKa. The source terminal of the transistor m2 receives a supply voltage Vcc. The gate terminal of the transistor m2 is connected with the node "a". The drain terminal of the transistor m2 is connected with the drain terminal of the transistor m1. The voltage of the high logic level is equal to the supply voltage Vcc. The voltage of the low logic level is equal to 0V.

The source terminal of the transistor m3 is connected with the node "a". The gate terminal of the transistor m3 is connected with the node "b". The drain terminal of the transistor m3 generates an acknowledging signal ACKb. The source terminal of the transistor m4 receives the supply voltage Vcc. The gate terminal of the transistor m4 is connected with the node "b". The drain terminal of the transistor m4 is connected with the drain terminal of the transistor m2.

In this embodiment, the low logic level (i.e., 0V) indicates that the signal is activated, and the high level (i.e., Vcc) indicates that the signal is inactivated.

In case that the request signals REQa and REQb are both inactivated, the voltages at the node "a" and the node "b" have the low logic level (i.e., 0V). The transistors m2 and m4 are turned on. The transistors m1 and m3 are turned off. Consequently, the acknowledging signals ACKa and ACKb are inactivated (i.e., Vcc).

In case that the request signal REQa is activated (i.e., 0V) and the request signal REQb is inactivated (i.e., Vcc), the voltage at the node "a" has the high logic level (i.e., Vcc) and the voltage at the node "b" has the low logic level (i.e., 0V). The transistors m1 and m4 are turned on. The transistors m2 and m3 are turned off. Consequently, the acknowledging signal ACKa is activated (i.e., 0V), and the acknowledging signal ACKb is inactivated (i.e., Vcc).

In case that the request signal REQa is inactivated (i.e., Vcc) and the request signal REQb is activated (i.e., 0V), the voltage at the node "a" has the low logic level (i.e., 0V) and the voltage at the node "b" has the high logic level (i.e., Vcc). The transistors m2 and m3 are turned on. The transistors m1 and m4 are turned off. Consequently, the acknowledging signal ACKa is inactivated (i.e., Vcc), and the acknowledging signal ACKb is activated (i.e., 0V).

As mentioned above, the arbitrating circuit 10 is capable of determining whether the acknowledging signal ACKa or the acknowledging signal ACKb is activated. If the request signal REQa is activated earlier, the acknowledging signal ACKa is activated and the acknowledging signal ACKb is inactivated. Whereas, if the request signal REQb is activated earlier, the acknowledging signal ACKb is activated and the acknowledging signal ACKa is inactivated.

However, if the request signals REQa and REQb are activated simultaneously, the acknowledging signal ACKa or the acknowledging signal ACKb generated by the arbitrating circuit 10 is unexpected. The reasons will be described as follows.

Please refer to FIG. 1B. At the time point ta, the request signals REQa and REQb are activated simultaneously (i.e., 0V). Meanwhile, the arbitrating circuit 10 is in a metastable state (MS).

In the metastable state, the voltages at the node "a" and the node "b" are in the range between the high logic level and the low logic level. At the time point tb, the arbitrating circuit 10 is not in the metastable state. Meanwhile, the voltage at the node "b" is decreased to the low logic level (i.e., 0V) and the voltage at the node "a" is increased to the high logic level (i.e., Vcc). Consequently, the acknowledging signal ACKa is activated (i.e., 0V), and the acknowledging signal ACKb is inactivated (i.e., Vcc).

Generally, the first NOR gate 12, a second NOR gate 14 and the transistors m1~m4 have different driving capabilities. Due to the differences of the driving capabilities, the arbitrating circuit 10 generates different results. That is, if the request signals REQa and REQb are activated simultaneously, the time duration of maintaining the arbitrating circuit in the metastable state is different and unexpected.

In some situations, the request signals REQa and REQb are activated simultaneously, but the acknowledging signal is different. For example, the voltage at the node "b" is increased to the high logic level and the voltage at the node "a" is decreased to the low logic level. Consequently, the acknowledging signal ACKa is inactivated, and the acknowledging signal ACKb is activated.

That is, if the request signals REQa and REQb are activated simultaneously, the result of the arbitrating circuit 10 is unexpected.

Figure 2A:
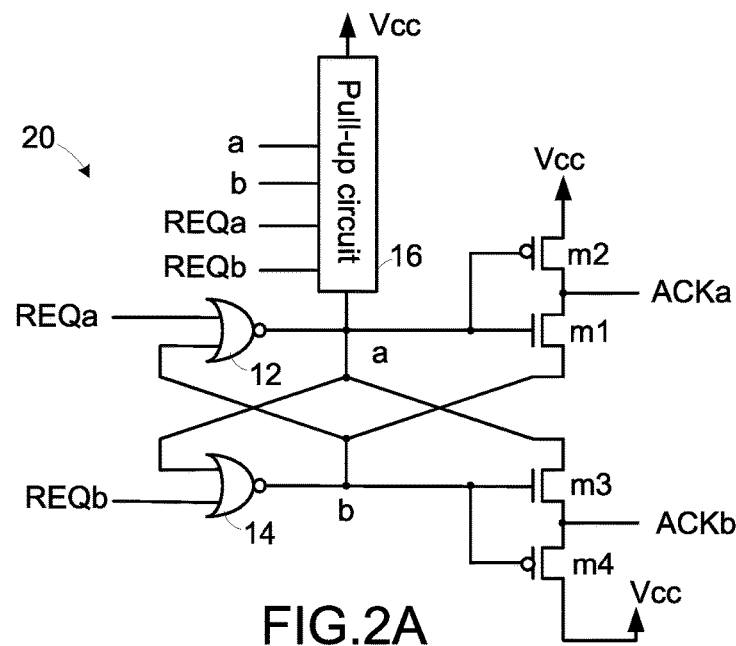
FIG. 2A is a schematic circuit diagram illustrating an arbitrating circuit according to a second embodiment of the present invention.
Figure 2C:
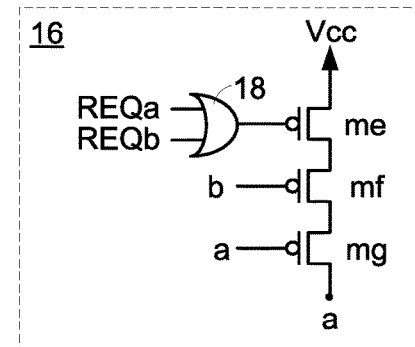
FIG. 2C is a schematic circuit diagram illustrating another exemplary pull-up circuit used in the arbitrating circuit of FIG. 2A.
Figure 2B:
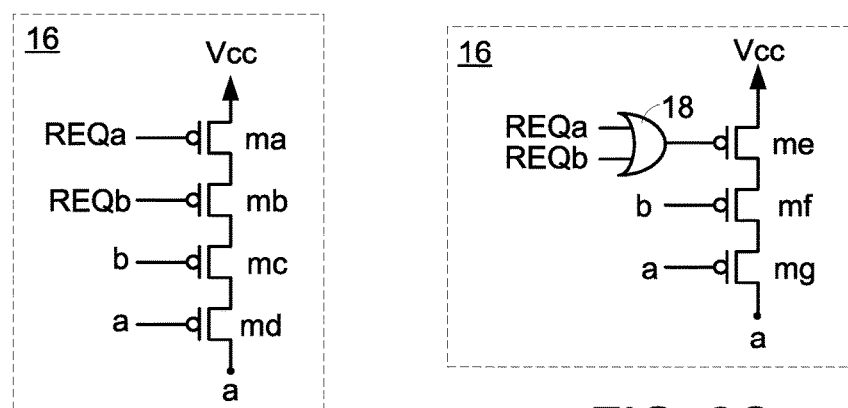
FIG. 2B is a schematic circuit diagram illustrating an exemplary pull-up circuit used in the arbitrating circuit of FIG. 2A.
Figure 2D:
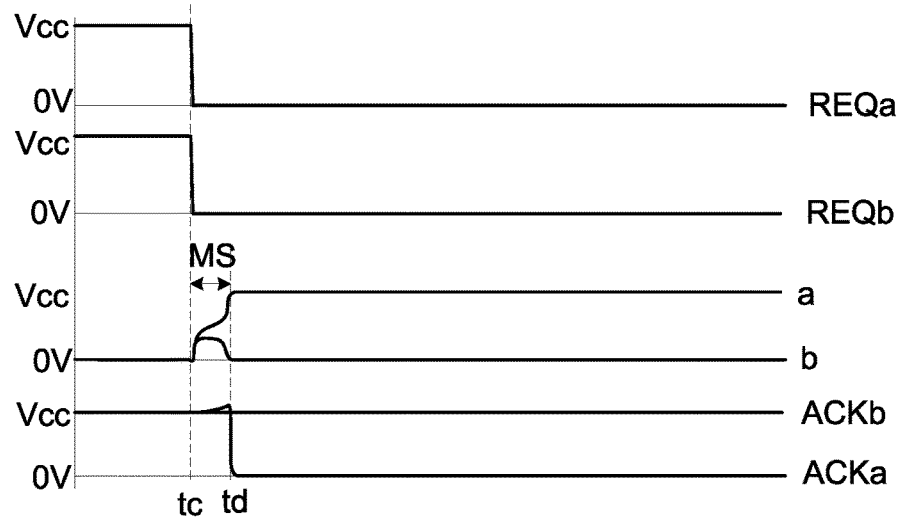
FIG. 2D is a schematic timing waveform diagram illustrating associated signals of the arbitrating circuit of FIG. 2A.

FIG. 2A is a schematic circuit diagram illustrating an arbitrating circuit according to a second embodiment of the present invention. FIG. 2B is a schematic circuit diagram illustrating an exemplary pull-up circuit used in the arbitrating circuit of FIG. 2A. FIG. 2C is a schematic circuit diagram illustrating another exemplary pull-up circuit used in the arbitrating circuit of FIG. 2A. FIG. 2D is a schematic timing waveform diagram illustrating associated signals of the arbitrating circuit of FIG. 2A.

As shown in FIG. 2A, the arbitrating circuit 20 comprises a first NOR gate 12, a second NOR gate 14, four transistors m1~m4 and a pull-up circuit 16.

In comparison with the first embodiment, the arbitrating circuit 20 of this embodiment further comprises the pull-up circuit 16. The pull-up circuit 16 is connected between the supply voltage Vcc and the node "a". The relationships between the other components of the arbitrating circuit 20 are similar to those of the first embodiment, and are not redundantly described herein.

In this embodiment, the pull-up circuit 16 is connected with the node "a", the node "b", the first input terminal of the first NOR gate 12 and the first input terminal of the second NOR gate 14. The pull-up circuit 16 is operated according to the voltage at the node "a", the voltage at the node "b", the request signal REQa and the request signal REQb. In case that both of the request signals REQa and REQb have the low logic level, the pull-up path of the pull-up circuit 16 is temporarily turned on. Under this circumstance, the voltage at the node "a" is pulled up to the supply voltage Vcc.

In the example of FIG. 2B, the pull-up circuit 16 comprises four transistors, which are connected between the node "a" and the supply voltage Vcc in series. The gate terminals of the four transistors are connected with the node "a", the node "b", the first input terminal of the first NOR gate 12 and the first input terminal of the second NOR gate 14, respectively.

Please refer to FIG. 2B again. The pull-up circuit 16 comprises the four transistors ma, mb, mc and md. The transistors ma, mb, mc and md are serially connected between the node "a" and the supply voltage Vcc to define the pull-up path. The transistors ma, mb, mc and md are P-type transistors. The drain terminal and the gate terminal of the transistor md are connected with the node "a". The drain terminal of the transistor mc is connected with the source terminal of the transistor md. The gate terminal of the transistor mc is connected with the node "b". The drain terminal of the transistor mb is connected with the source terminal of the transistor mc. The gate terminal of the transistor mb receives the request signal REQb. The drain terminal of the transistor ma is connected with the source terminal of the transistor mb. The gate terminal of the transistor ma receives the request signal REQa. The source terminal of the transistor ma is connected with the supply voltage Vcc.

It is noted that the signals to be received by the four gate terminals of the pull-up circuit 16 may be varied according to the practical requirements. For example, in another embodiment, the gate terminals of the transistors md, mc, mb and ma are connected with node "b", the node "a", the request signal REQa and the request signal REQb, respectively.

In the example of FIG. 2C, the pull-up circuit 16 comprises an OR gate 18 and three transistors. The two input terminals of the OR gate 18 receive the request signals REQa and REQb, respectively. The three transistors are connected between the node "a" and the supply voltage Vcc in series. The gate terminals of the three transistors are connected with the node "a", the node "b" and the output terminal of the OR gate 18, respectively.

Please refer to FIG. 2C again. The pull-up circuit 16 comprises the three transistors me, mf and mg and the OR gate 18. The transistors me, mf and mg are serially connected between the node "a" and the supply voltage Vcc to define the pull-up path. The transistors me, mf and mg are P-type transistors. The drain terminal and the gate terminal of the transistor mg are connected with the node "a". The drain terminal of the transistor mf is connected with the source terminal of the transistor mg. The gate terminal of the transistor mf is connected with the node "b". The drain terminal of the transistor me is connected with the source terminal of the transistor mf. The source terminal of the transistor me is connected with the supply voltage Vcc. The two input terminals of the OR gate 18 receive the request signals REQa and REQb. The output terminal of the OR gate 18 is connected with the gate terminal of the transistor me.

It is noted that the signals to be received by the three gate terminals of the pull-up circuit 16 may be varied according to the practical requirements. For example, in another embodiment, the gate terminals of the transistors mg, mf and me are connected with node "b", the node "a" and the output terminal of the OR gate 18, respectively.

The examples of the pull-up circuit 16 as shown in FIGS. 2B and 2C are presented herein for purpose of illustration and description only. It is apparent to those ordinarily skilled in the art that numerous modifications and alterations may be made while retaining the teachings of the invention.

Similarly, the low logic level (i.e., 0V) indicates that the signal is activated, and the high level (i.e., Vcc) indicates that the signal is inactivated.

In case that the request signals REQa and REQb are both inactivated (i.e., Vcc), the voltages at the node "a" and the node "b" have the low logic level (i.e., 0V). The transistors m2 and m4 are turned on. The transistors m1 and m3 are turned off. That is, the pull-up path of the pull-up circuit 16 is turned off. Consequently, the acknowledging signals ACKa and ACKb are inactivated (i.e., Vcc).

In case that the request signal REQa is activated (i.e., 0V) and the request signal REQb is inactivated (i.e., Vcc), the voltage at the node "a" has the high logic level (i.e., Vcc) and the voltage at the node "b" has the low logic level (i.e., 0V). The transistors m1 and m4 are turned on. The transistors m2 and m3 are turned off. That is, the pull-up path of the pull-up circuit 16 is turned off. Consequently, the acknowledging signal ACKa is activated (i.e., 0V), and the acknowledging signal ACKb is inactivated (i.e., Vcc).

In case that the request signal REQa is inactivated (i.e., Vcc) and the request signal REQb is activated (i.e., 0V), the voltage at the node "a" has the low logic level (i.e., 0V) and the voltage at the node "b" has the high logic level (i.e., Vcc). The transistors m2 and m3 are turned on. The transistors m1 and m4 are turned off. That is, the pull-up path of the pull-up circuit 16 is turned off. Consequently, the acknowledging signal ACKa is inactivated (i.e., Vcc), and the acknowledging signal ACKb is activated (i.e., 0V).

As mentioned above, the arbitrating circuit 20 is capable of determining whether the acknowledging signal ACKa or the acknowledging signal ACKb is activated. If the request signal REQa is activated earlier, the acknowledging signal ACKa is activated and the acknowledging signal ACKb is inactivated. Whereas, if the request signal REQb is activated earlier, the acknowledging signal ACKb is activated and the acknowledging signal ACKa is inactivated. Moreover, if the request signals REQa and REQb are not simultaneously activated, the pull-up path of the pull-up circuit 16 is turned off.

In this embodiment, if the request signals REQa and REQb of the arbitrating circuit 20 are activated simultaneously, the acknowledging signal ACKa is activated, and the acknowledging signal ACKb is inactivated. The reasons will be described as follows in more details.

Please refer to FIG. 2D. At the time point tc, the request signals REQa and REQb are activated simultaneously (i.e., 0V). Meanwhile, the arbitrating circuit 20 is in a metastable state (MS).

In the metastable state, the request signals REQa and REQb have the low logic level (i.e., 0V), and the voltages at the node "a" and the node "b" are in the range between the high logic level and the low logic level. Consequently, the transistors ma, mb, mc and of the pull-up circuit 16 as shown in FIG. 2B are turned on. That is, the pull-up path of the pull-up circuit 16 is turned on. Similarly, in the metastable state, the transistors me, mf and mg of the pull-up circuit 16 as shown in FIG. 2C are turned on. That is, the pull-up path of the pull-up circuit 16 is turned on.

That is, at the time point tc, the pull-up path is turned on. Consequently, the voltage at the node "a" is pulled up to the high logic level (i.e., Vcc) quickly, and the voltage at the node "b" is decreased to the low logic level (i.e., 0V) quickly.

At the time point td, the voltage at the node "a" has the high logic level (i.e., Vcc) and the voltage at the node "b" has the low logic level (i.e., 0V). Consequently, the pull-up path of the pull-up circuit 16 is turned off again. The arbitrating circuit 20 is not in the metastable state. The transistors m1 and m4 are turned on. The transistors m2 and m3 are turned off. Consequently, the acknowledging signal ACKa is activated (i.e., 0V), and the acknowledging signal ACKb is inactivated (i.e., Vcc).

As mentioned in FIG. 2D, the pull-up path of the pull-up circuit 16 is temporarily turned on when both of the request signals REQa and REQb are activated (i.e., 0V). Under this circumstance, the voltage at the node "a" has the high logic level (i.e., Vcc), and the voltage at the node "b" has the low logic level (i.e., 0V). Consequently, the acknowledging signal ACKa is activated (i.e., 0V), and the acknowledging signal ACKb is inactivated (i.e., Vcc).

In the above two embodiments, the low logic level (i.e., 0V) indicates that the signal is activated, and the high level (i.e., Vcc) indicates that the signal is inactivated. It is noted that numerous modifications and alterations may be made while retaining the teachings of the invention. For example, in another embodiment, the high level (i.e., Vcc) indicates that the signal is activated and the low logic level (i.e., 0V) indicates that the signal is inactivated.

Figure 3A:
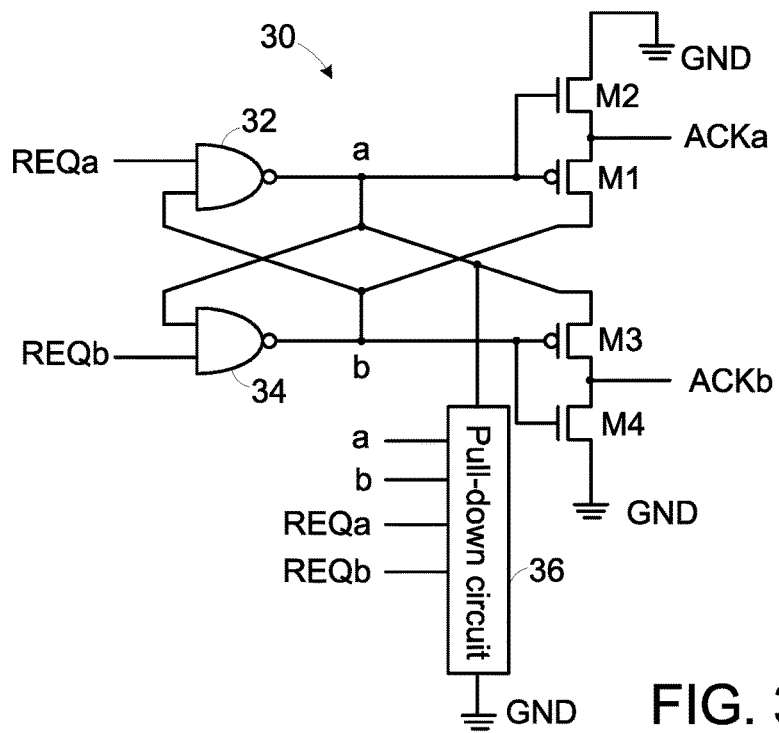
FIG. 3A is a schematic circuit diagram illustrating an arbitrating circuit according to a third embodiment of the present invention.

FIG. 3A is a schematic circuit diagram illustrating an arbitrating circuit according to a third embodiment of the present invention. FIG. 3B is a schematic circuit diagram illustrating an exemplary pull-down circuit used in the arbitrating circuit of FIG. 3A. FIG. 3C is a schematic circuit diagram illustrating another exemplary pull-down circuit used in the arbitrating circuit of FIG. 3A. FIG. 3D is a schematic timing waveform diagram illustrating associated signals of the arbitrating circuit of FIG. 3A.

As shown in FIG. 3A, the arbitrating circuit 30 comprises a first NAND gate 32, a second NAND gate 34, four transistors M1~M4 and a pull-down circuit 36. The transistors M1 and M3 are P-type transistors, and the transistors M2 and M4 are N-type transistors.

A first input terminal of the first NAND gate 32 receives the request signal REQa. A second input terminal of the first NAND gate 32 is connected with the node "b". An output terminal of the first NAND gate 32 is connected with the node "a". A first input terminal of the second NAND gate 34 receives the request signal REQb. A second input terminal of the second NAND gate 34 is connected with the node "a". An output terminal of the second NAND gate 34 is connected with the node "b".

The source terminal of the transistor M1 is connected with the node "b". The gate terminal of the transistor M1 is connected with the node "a". The drain terminal of the transistor M1 generates an acknowledge signal ACKa. The source terminal of the transistor M2 is connected with a ground terminal GND. The gate terminal of the transistor M2 is connected with the node "a". The drain terminal of the transistor M2 is connected with the drain terminal of the transistor M1. The voltage of the ground terminal GND is equal to 0V, indicating the low logic level. The voltage of the high logic level is equal to the supply voltage Vcc.

The source terminal of the transistor M3 is connected with the node "a". The gate terminal of the transistor M3 is connected with the node "b". The drain terminal of the transistor M3 generates an acknowledge signal ACKb. The source terminal of the transistor M4 is connected with the ground terminal GND. The gate terminal of the transistor M4 is connected with the node "b". The drain terminal of the transistor M4 is connected with the drain terminal of the transistor M3.

In this embodiment, the pull-down circuit 36 is connected with the node "a", the node "b", the first input terminal of the first NAND gate 32 and the first input terminal of the second NAND gate 34. The pull-down circuit 36 is operated according to the voltage at the node "a", the voltage at the node "b", the request signal REQa and the request signal REQb. In case that both of the request signals REQa and REQb have the high logic level, the pull-down path of the pull-down circuit 36 is temporarily turned on. Under this circumstance, the voltage at the node "a" is pulled down to the 0V.

In the example of FIG. 3B, the pull-down circuit 36 comprises four transistors, which are connected between the node "a" and the ground terminal GND in series. The gate terminals of the four transistors are connected with the node "a", the node "b", the first input terminal of the first NAND gate 32 and the first input terminal of the second NAND gate 34, respectively.

Please refer to FIG. 3B again. The pull-down circuit 36 comprises the four transistors Ma, Mb, Mc and Md. The transistors Ma, Mb, Mc and Md are serially connected between the node "a" and the ground terminal GND to define the pull-down path. The transistors Ma, Mb, Mc and Md are N-type transistors. The drain terminal and the gate terminal of the transistor Ma are connected with the node "a". The drain terminal of the transistor Mb is connected with the source terminal of the transistor Ma. The gate terminal of the transistor Mb is connected with the node "b". The drain terminal of the transistor Mc is connected with the source terminal of the transistor Mb. The gate terminal of the transistor Mc receives the request signal REQa. The drain terminal of the transistor Md is connected with the source terminal of the transistor Mc. The gate terminal of the transistor Md receives the request signal REQb. The source terminal of the transistor Md is connected with the ground terminal GND.

It is noted that the signals to be received by the four gate terminals of the pull-down circuit 36 may be varied according to the practical requirements. For example, in another embodiment, the gate terminals of the transistors Ma, Mb, Mc and Md are connected with node "b", the node "a", the request signal REQb and the request signal REQa, respectively.

In the example of FIG. 3C, the pull-down circuit 36 comprises an AND gate 38 and three transistors. The two input terminals of the AND gate 38 receive the request signals REQa and REQb, respectively. The three transistors are connected between the node "a" and the ground terminal GND in series. The gate terminals of the three transistors are connected with the node "a", the node "b" and the output terminal of the AND gate 38, respectively.

Please refer to FIG. 3C again. The pull-down circuit 36 comprises the three transistors Me, Mf and Mg and the AND gate 38. The transistors Me, Mf and Mg are N-type transistors. The transistors Me, Mf and Mg are serially connected between the node "a" and the ground terminal GND to define the pull-down path. The drain terminal and the gate terminal of the transistor Me are connected with the node "a". The drain terminal of the transistor Mf is connected with the source terminal of the transistor Me. The gate terminal of the transistor Mf is connected with the node "b". The drain terminal of the transistor Mg is connected with the source terminal of the transistor Mf. The source terminal of the transistor Mg is connected with the ground terminal GND. The two input terminals of the AND gate 38 receive the request signals REQa and REQb. The output terminal of the AND gate 38 is connected with the gate terminal of the transistor Mg.

It is noted that the signals to be received by the three gate terminals of the pull-down circuit 36 may be varied according to the practical requirements. For example, in another embodiment, the gate terminals of the transistors Me, Mf and Me are connected with node "b", the node "a" and the output terminal of the AND gate 38, respectively.

The examples of the pull-down circuit 36 as shown in FIGS. 3B and 3C are presented herein for purpose of illustration and description only. It is apparent to those ordinarily skilled in the art that numerous modifications and alterations may be made while retaining the teachings of the invention.

In the arbitrating circuit 30, the high level (i.e., Vcc) indicates that the signal is activated, and the low logic level (i.e., 0V) indicates that the signal is inactivated.

In case that the request signals REQa and REQb are both inactivated (i.e., 0V), the voltages at the node "a" and the node "b" have the high logic level (i.e., Vcc). The transistors M2 and M4 are turned on. The transistors M1 and M3 are turned off. That is, the pull-down path of the pull-down circuit 36 is turned off. Consequently, the acknowledging signals ACKa and ACKb are inactivated (i.e., 0V).

In case that the request signal REQa is activated (i.e., Vcc) and the request signal REQb is inactivated (i.e., 0V), the voltage at the node "a" has the low logic level (i.e., 0V) and the voltage at the node "b" has the high logic level (i.e., Vcc). The transistors M1 and M4 are turned on. The transistors M2 and M3 are turned off. That is, the pull-down path of the pull-down circuit 36 is turned off. Consequently, the acknowledging signal ACKa is activated (i.e., Vcc), and the acknowledging signal ACKb is inactivated (i.e., 0V).

In case that the request signal REQa is inactivated (i.e., 0V) and the request signal REQb is activated (i.e., Vcc), the voltage at the node "a" has the high logic level (i.e., Vcc) and the voltage at the node "b" has the low logic level (i.e., 0V). The transistors M2 and M3 are turned on. The transistors M1 and M4 are turned off. That is, the pull-down path of the pull-down circuit 36 is turned off. Consequently, the acknowledging signal ACKa is inactivated (i.e., 0V), and the acknowledging signal ACKb is activated (i.e., Vcc).

As mentioned above, the arbitrating circuit 30 is capable of determining whether the acknowledging signal ACKa or the acknowledging signal ACKb is activated. If the request signal REQa is activated earlier, the acknowledging signal ACKa is activated and the acknowledging signal ACKb is inactivated. Whereas, if the request signal REQb is activated earlier, the acknowledging signal ACKb is activated and the acknowledging signal ACKa is inactivated. Moreover, if the request signals REQa and REQb are not simultaneously activated, the pull-down path of the pull-down circuit 36 is turned off.

In this embodiment, if the request signals REQa and REQb of the arbitrating circuit 30 are activated simultaneously, the acknowledging signal ACKa is activated, and the acknowledging signal ACKb is inactivated. The reasons will be described as follows in more details.

Please refer to FIG. 3D. At the time point te, the request signals REQa and REQb are activated simultaneously (i.e., Vcc). Meanwhile, the arbitrating circuit 30 is in a metastable state (MS).

In the metastable state, the request signals REQa and REQb have the high logic level (i.e., 0V), and the voltages at the node "a" and the node "b" are in the range between the high logic level and the low logic level. Consequently, the transistors Ma, Mb, Mc and Md of the pull-down circuit 36 as shown in FIG. 3B are turned on. That is, the pull-down path of the pull-down circuit 36 is turned on. Similarly, in the metastable state, the transistors Me, Mf and Mg of the pull-down circuit 36 as shown in FIG. 3C are turned on. That is, the pull-down path of the pull-down circuit 36 is turned on.

That is, at the time point te, the pull-down path is turned on. Consequently, the voltage at the node "a" is pulled down to the low logic level (i.e., 0V) quickly, and the voltage at the node "b" is increased to the high logic level (i.e., Vcc) quickly.

At the time point tf, the voltage at the node "a" has the low logic level (i.e., 0V) and the voltage at the node "b" has the high logic level (i.e., Vcc). Consequently, the pull-down path of the pull-down circuit 36 is turned off again. The arbitrating circuit 30 is not in the metastable state. The transistors M1 and M4 are turned on. The transistors M2 and M3 are turned off. Consequently, the acknowledging signal ACKa is activated (i.e., Vcc), and the acknowledging signal ACKb is inactivated (i.e., 0V).

As mentioned in FIG. 3D, the pull-down path of the pull-down circuit 36 is temporarily turned on when both of the request signals REQa and REQb are activated (i.e., Vcc). Under this circumstance, the voltage at the node "a" has the low logic level (i.e., 0V), and the voltage at the node "b" has the high logic level (i.e., Vcc). Consequently, the acknowledging signal ACKa is activated (i.e., Vcc), and the acknowledging signal ACKb is inactivated (i.e., 0V).

From the above descriptions, the present invention provides an arbitrating circuit. If the two request signals REQa and REQb received by the arbitrating circuit are activated simultaneously, the pull-up circuit or the pull-down circuit is used to allow the arbitrating circuit to be departed from the metastable state. Moreover, the acknowledging signal ACKa is activated, and the acknowledging signal ACKb is inactivated.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An arbitrating circuit, comprising:
a first NOR gate, wherein a first input terminal of the first NOR gate receives a first request signal, a second input terminal of the first NOR gate is connected with a first node, and an output terminal of the first NOR gate is connected with a second node;
a second NOR gate, wherein a first input terminal of the second NOR gate receives a second request signal, a second input terminal of the second NOR gate is connected with the second node, and an output terminal of the second NOR gate is connected with the first node;

a first transistor, wherein a source terminal of the first transistor is connected with the first node, a gate terminal of the first transistor is connected with the second node, and a drain terminal of the first transistor generates a first acknowledging signal;

a second transistor, wherein a source terminal of the second transistor is connected with a supply voltage, a gate terminal of the second transistor is connected with the second node, and a drain terminal of the second transistor is connected with the drain terminal of the first transistor;

a third transistor, wherein a source terminal of the third transistor is connected with the second node, a gate terminal of the third transistor is connected with the first node, and a drain terminal of the third transistor generates a second acknowledging signal;

a fourth transistor, wherein a source terminal of the fourth transistor is connected with the supply voltage, a gate terminal of the fourth transistor is connected with the first node, and a drain terminal of the fourth transistor is connected with the drain terminal of the third transistor; and a pull-up circuit connected with the first node, the second node, the first input terminal of the first NOR gate and the first input terminal of the second NOR gate, wherein if both of the first request signal and the second request signal have a low logic level, a voltage at the second node is pulled up to a high logic level by the pull-up circuit.

2. The arbitrating circuit as claimed in claim 1, wherein the pull-up circuit comprises four transistors, which are connected between the second node and the supply voltage in series, wherein gate terminals of the four transistors of the pull-up circuit are connected with the first node, the second node, the first input terminal of the first NOR gate and first input terminal of the second NOR gate, respectively.

3. The arbitrating circuit as claimed in claim 2, wherein the four transistors of the pull-up circuit comprises:

a fifth transistor including a drain terminal connected with the second node, a gate terminal connected with the second node and a source terminal;

a sixth transistor including a drain terminal connected with the source terminal of the fifth transistor, a gate terminal connected with the first node, and a source terminal;

a seventh transistor including a drain terminal connected with the source terminal of the sixth transistor, a gate terminal connected with the first input terminal of the second NOR gate, and a source terminal; and an eighth transistor including a drain terminal connected with the source terminal of the seventh transistor, a gate terminal connected with the first input terminal of the first NOR gate, and a source terminal connected with the supply voltage.

4. The arbitrating circuit as claimed in claim 1, wherein the pull-up circuit comprises:

an OR gate including a first input terminal receiving the first request signal, a second input terminal receiving the second request signal and an output terminal; and three transistors, which are connected between the second node and the supply voltage in series, wherein gate terminals of the three transistors of the pull-up circuit are connected with the first node, the second node and the output terminal of the OR gate, respectively.

5. The arbitrating circuit as claimed in claim 4, wherein the three transistors of the pull-up circuit comprises:

a ninth transistor including a drain terminal connected with the second node, a gate terminal connected with the second node and a source terminal;

a tenth transistor including a drain terminal connected with the source terminal of the ninth transistor, a gate terminal connected with the first node, and a source terminal; and an eleventh transistor including a drain terminal connected with the source terminal of the tenth transistor, a gate terminal connected with the output terminal of the OR gate, and a source terminal connected with the supply voltage.

6. An arbitrating circuit, comprising:

a first NAND gate, wherein a first input terminal of the first NAND gate receives a first request signal, a second input terminal of the first NAND gate is connected with a first node, and an output terminal of the first NAND gate is connected with a second node;

a second NAND gate, wherein a first input terminal of the second NAND gate receives a second request signal, a second input terminal of the second NAND gate is connected with the second node, and an output terminal of the second NAND gate is connected with the first node;

a first transistor, wherein a source terminal of the first transistor is connected with the first node, a gate terminal of the first transistor is connected with the second node, and a drain terminal of the first transistor generates a first acknowledging signal;

a second transistor, wherein a source terminal of the second transistor is connected with a ground terminal, a gate terminal of the second transistor is connected with the second node, and a drain terminal of the second transistor is connected with the drain terminal of the first transistor;

a third transistor, wherein a source terminal of the third transistor is connected with the second node, a gate terminal of the third transistor is connected with the first node, and a drain terminal of the third transistor generates a second acknowledging signal;

a fourth transistor, wherein a source terminal of the fourth transistor is connected with the ground terminal, a gate terminal of the fourth transistor is connected with the first node, and a drain terminal of the fourth transistor is connected with the drain terminal of the third transistor; and a pull-down circuit connected with the first node, the second node, the first input terminal of the first NAND gate and the first input terminal of the second NAND gate, wherein if both of the first request signal and the second request signal have a high logic level, a voltage at the second node is pulled down to a low logic level by the pull-down circuit.

7. The arbitrating circuit as claimed in claim 6, wherein the pull-down circuit comprises four transistors, which are connected between the second node and the ground terminal in series, wherein gate terminals of the four transistors of the pull-down circuit are connected with the first node, the second node, the first input terminal of the first NAND gate and the first input terminal of the second NAND gate, respectively.

8. The arbitrating circuit as claimed in claim 7, wherein the four transistors of the pull-down circuit comprises:

a fifth transistor including a drain terminal connected with the second node, a gate terminal connected with the second node and a source terminal;

a sixth transistor including a drain terminal connected with the source terminal of the fifth transistor, a gate terminal connected with the first node and a source terminal;

a seventh transistor including a drain terminal connected with the source terminal of the sixth transistor, a gate terminal connected with the first input terminal of the first NAND gate and a source terminal; and an eighth transistor including a drain terminal connected with the source terminal of the seventh transistor, a gate terminal connected with the first input terminal of the second NAND gate and a source terminal connected with the ground terminal.

9. The arbitrating circuit as claimed in claim 6, wherein the pull-down circuit comprises:

an AND gate including a first input terminal receiving the first request signal, a second input terminal receiving the second request signal and an output terminal; and three transistors, which are connected between the second node and the ground terminal in series, wherein gate terminals of the three transistors of the pull-down circuit are connected with the first node, the second node and the output terminal of the AND gate, respectively.

10. The arbitrating circuit as claimed in claim 9, wherein the three transistors of the pull-up circuit comprises:

a ninth transistor including a drain terminal connected with the second node, a gate terminal connected with the second node and a source terminal;

a tenth transistor including a drain terminal connected with the source terminal of the ninth transistor, a gate terminal connected with the first node and a source terminal; and an eleventh transistor including a drain terminal connected with the source terminal of the tenth transistor, a gate terminal connected with the output terminal of the AND gate and a source terminal connected with the ground terminal.

* * * * *